United States Patent [19]

Roberts et al.

[11] Patent Number: 5,975,201
[45] Date of Patent: *Nov. 2, 1999

[54] HEAT SINK FOR INCREASING THROUGH-THICKNESS THERMAL CONDUCTIVITY OF ORGANIC MATRIX COMPOSITE STRUCTURES

[75] Inventors: Jack C. Roberts, Columbia; Mark H. Luesse, Westminster, both of Md.

[73] Assignee: The Johns Hopkins University, Baltimore, Md.

[ * ] Notice: This patent issued on a continued prosecution application filed under 37 CFR 1.53(d), and is subject to the twenty year patent term provisions of 35 U.S.C. 154(a)(2).

[21] Appl. No.: 08/728,734

[22] Filed: Oct. 11, 1996

Related U.S. Application Data

[63] Continuation of application No. 08/331,765, Oct. 31, 1994, abandoned.

[51] Int. Cl.$^6$ ........................................................ F28F 7/00
[52] U.S. Cl. ........................... 165/185; 165/905; 428/105; 428/188; 428/212; 428/408; 428/901; 361/705; 361/710; 361/708; 361/709; 29/830
[58] Field of Search ...................................... 165/906, 905, 165/185, 80.3, 80.2; 29/830; 257/721; 361/710, 709, 708, 707, 705, 704; 428/105, 181, 188, 212, 408, 901

[56] References Cited

U.S. PATENT DOCUMENTS

| | | | |
|---|---|---|---|
| 3,768,706 | 10/1973 | Jensen | 428/105 X |
| 4,283,464 | 8/1981 | Hascoe | 165/185 X |
| 4,368,503 | 1/1983 | Kurosawa et al. | 361/414 |
| 4,384,016 | 5/1983 | Ide et al. | 428/105 X |
| 4,574,879 | 3/1986 | DeGree et al. | 165/185 |
| 4,810,563 | 3/1989 | DeGree et al. | 165/185 X |
| 4,820,567 | 4/1989 | Scola et al. | 428/105 |
| 4,837,664 | 6/1989 | Rodriguez, II et al. | 165/185 X |
| 4,849,858 | 7/1989 | Grapes et al. | 165/185 X |
| 4,854,038 | 8/1989 | Wiley | 29/830 |
| 4,867,235 | 9/1989 | Grapes et al. | 165/185 |
| 4,888,247 | 12/1989 | Zweben et al. | 428/105 |
| 4,912,601 | 3/1990 | Seipler | 165/185 X |
| 5,008,737 | 4/1991 | Burnham et al. | 165/905 X |
| 5,012,387 | 4/1991 | Ohlenburger | 165/80.3 X |
| 5,075,821 | 12/1991 | McDonnal | 165/185 |
| 5,111,359 | 5/1992 | Montesano | 165/80.2 X |
| 5,224,030 | 6/1993 | Banks et al. | 165/185 X |
| 5,255,738 | 10/1993 | Przilas | 165/185 |
| 5,384,181 | 1/1995 | Arthur et al. | 428/901 X |
| 5,407,727 | 4/1995 | Newell | 165/185 X |
| 5,441,814 | 8/1995 | Gunji et al. | 428/901 X |

FOREIGN PATENT DOCUMENTS 3115017  11/1982  Germany .

*Primary Examiner*—Christopher Atkinson
*Attorney, Agent, or Firm*—Eugene J. Pawlikowski; Carla Magda Krivak

[57] ABSTRACT

Polymer matrix composites have a through-thickness-thermal conductivity whose value is realized in applications such as composite spaceborne electronics enclosures where heat dissipation is entirely dependent on thermal conduction to a heat sink. The technique involves interlaminating a high thermal conductivity pitch fiber/epoxy and a low thermal conductivity carbon fabric epoxy within a sandwich of copper foil outer plies. Once the copper is laminated on the surface, it is etched from areas not exposed to the heat. A hole may be drilled transversely through the laminated composite and the walls of the space defining the opening are copper plated. The high thermal conductivity of the copper allows heat transfer from the heat source through the opening to the high thermal conductivity fibers which then transfer the heat to a heat sink.

3 Claims, 4 Drawing Sheets

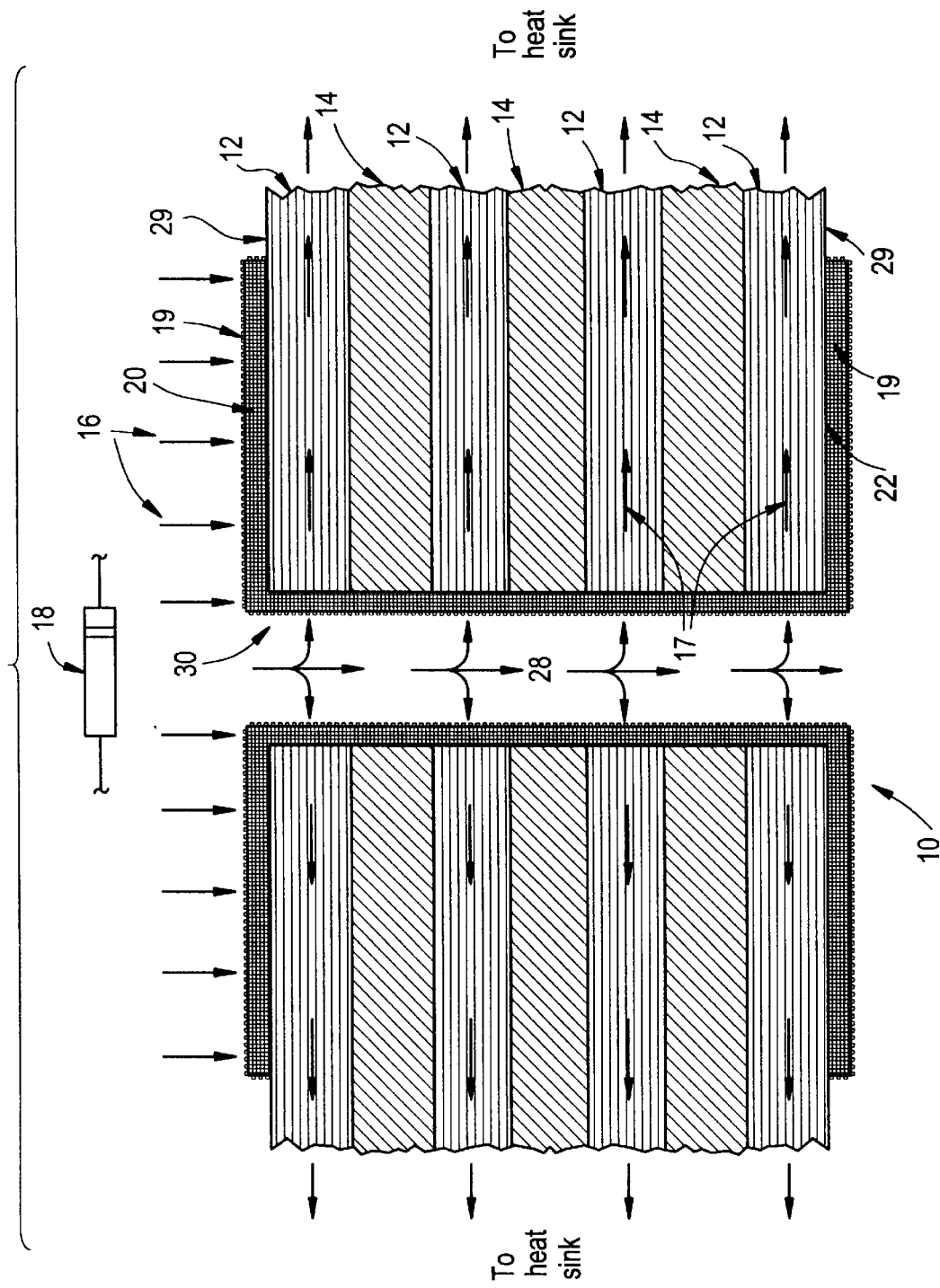

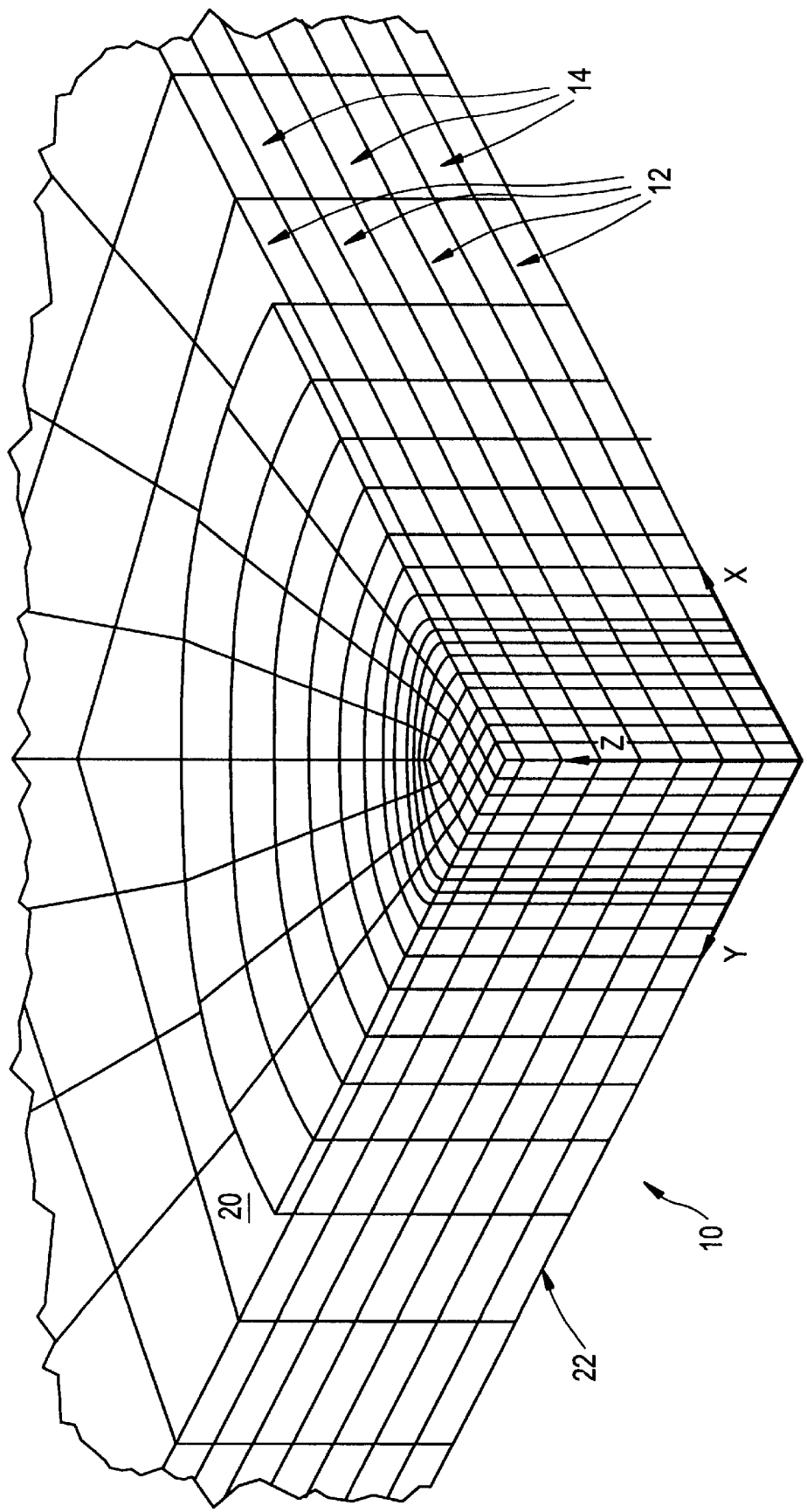

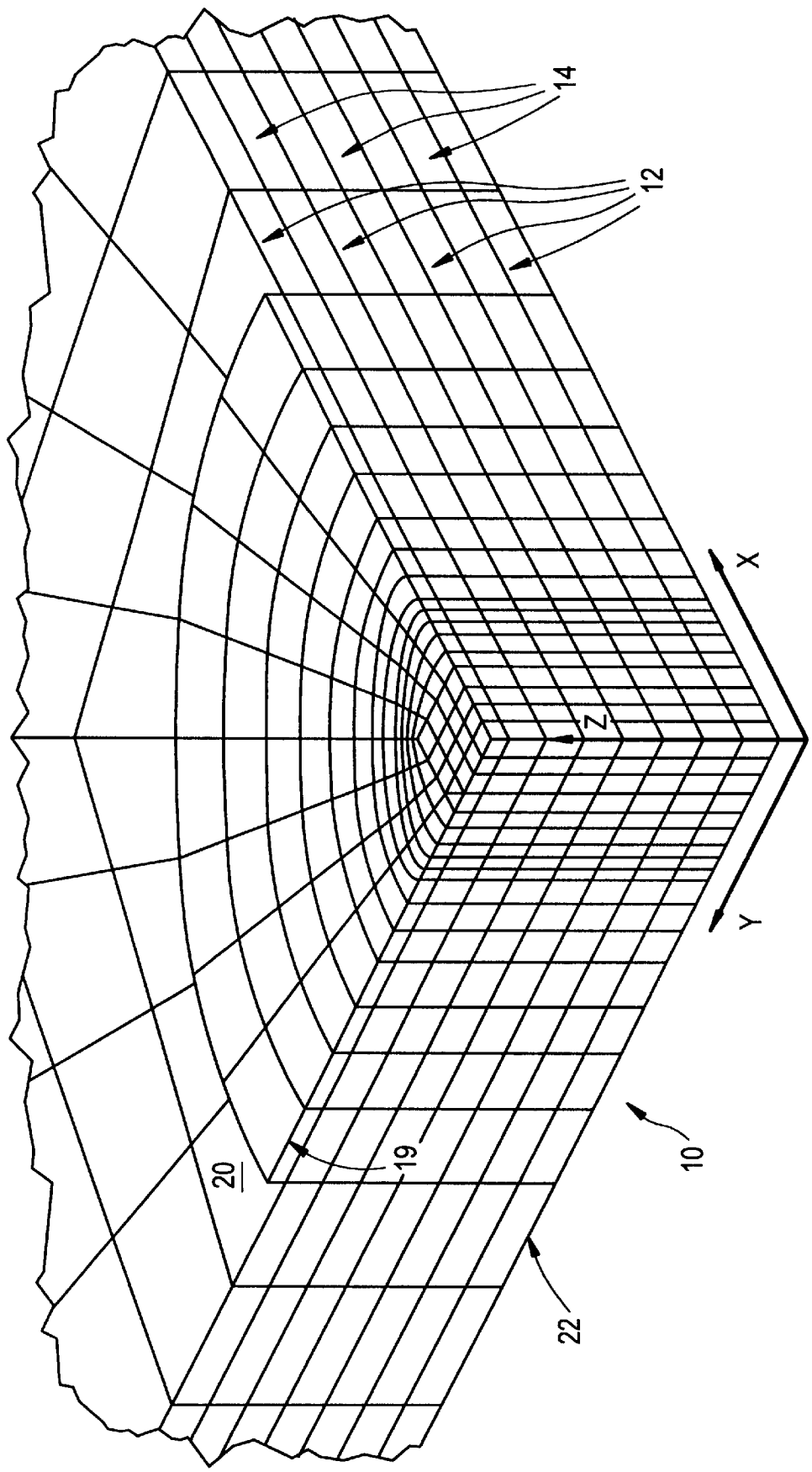

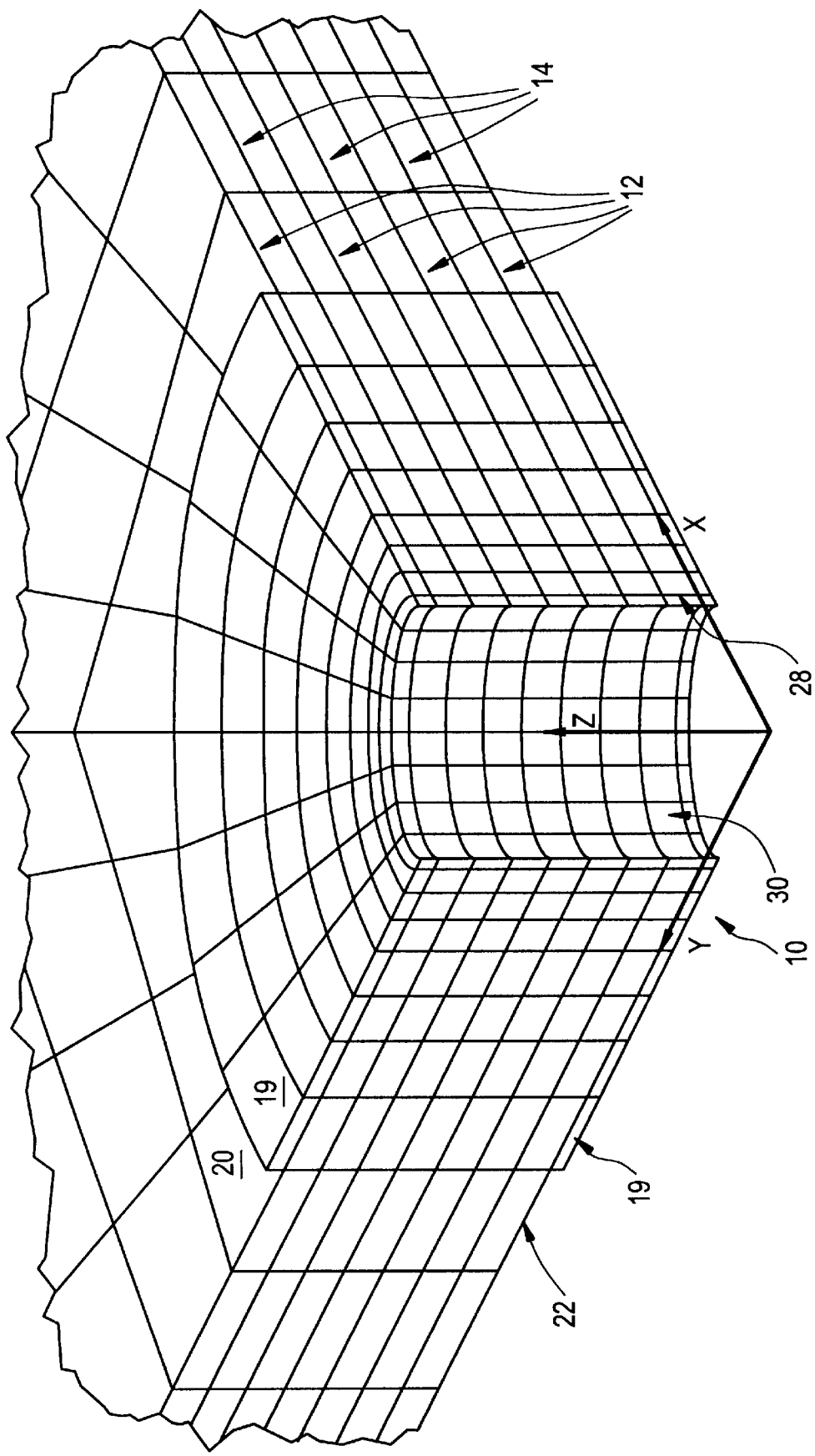

HEAT SINK FOR INCREASING THROUGH-THICKNESS THERMAL CONDUCTIVITY OF ORGANIC MATRIX COMPOSITE STRUCTURES

This is a continuation of copending application(s) Ser. No. 08/331,765 filed on Oct. 31, 1994 now abandoned.

STATEMENT OF GOVERNMENTAL INTEREST

The Government has rights in this invention pursuant to Contract No. N00039-94-C-0001 awarded by the Department of the Navy.

BACKGROUND OF THE INVENTION

1. Field of the Invention:

The invention relates to a technique for locally increasing the surface heat spreading and through-thickness thermal conductivity of graphite/epoxy laminates. More particularly, the spreading of heat and the heat exchange efficiency of a composite matrix is achieved by employing high thermal conductivity fibers and low thermal conductivity fibers alternately arranged in a stacked configuration.

2. Discussion of the Prior Art

The polymer matrix composite through-thickness thermal conductivity in a composite becomes particularly important in applications such as composite space electronics enclosures where the heat dissipation is entirely dependent on thermal conduction to a heat sink. The spreading of heat at the composite surface and subsequent localized conduction in the through-thickness direction down to high thermal conductivity fiber is thought to be the key to designing a light weight, thermally efficient enclosure. Consequently, there exists a need for lightweight, thermally conductive electronics enclosures for spaceborne applications. However, the thermal conductivity of most carbon fabric/epoxy composites is very low (1–2 W/m°K) compared to aluminum (180 W/m°K) and copper (390 W/m°K).

Authorities list the thermal conductivity of uni-directional graphite/epoxy (Hercules AS-1/3502) as 6.3 W/m°K (longitudinal direction), 1.1 W/m°K (transverse direction) and 0.77 W/m°K (through thickness direction). Other authorities predict the in-plane thermal conductivity for 35% fiber, plain weave graphite/epoxy as 1.5 W/m°K and 0.25 W/m°K in the through thickness direction. Pitch fiber (AMOCO P-120 or K1100) epoxy composites have a longitudinal thermal conductivity of, respectively, 360 W/m°K and 500 W/m°K in uni-directional laminates. However, the through-thickness thermal conductivity is still low, on the order of 1–2 W/m°K. Also known is the use of chemical vapor deposition of diamond coatings with a thermal conductivity of 1800–2000 W/m°K to increase the surface conductivity in microelectronics. Differences in processing temperatures and techniques apparently render the diamond approach as unlikely to be suited for polymer matrix composites.

Low conductivity in the through-thickness direction of uni-directional pitch fiber composites thus poses problems in any design that requires a thermal path to a high thermal conductivity fiber, particularly where large amounts of heat are input over small areas. As one approach, introducing metal particles into the matrix will increase the through-thickness conductivity throughout the composite; however, the weight density of the metallic composite over a polymer matrix composite is greatly increased. Locally increasing the through-thickness thermal conductivity and then allowing the high thermal conductivity fibers to spread and orient the heat flow to a sink appears to be an optimal solution to this problem.

SUMMARY OF THE INVENTION

The technique of the invention accomplishes an improved spreading of heat at the surface of a polymer composite and subsequent localized conduction in the through-thickness direction down to high thermal conductivity fiber. A finite element model was constructed of a composite with heat applied to a central area. Alternately arranged laminates stacked one above the other in a parallel array consist of a hybrid of high thermal conductivity pitch fiber/epoxy plies interlaminated with low thermal conductivity carbon fabric/epoxy plies in a predetermined design configuration. Three different arrangements showing the advantages of the invention were modeled as follows:

a. a heat source located above and approximately in the middle of the composite so as to expose the composite to conduction directly from the source, b. a thermally conductive metal laminated to the composite in the vicinity of the central heat source, and c. a thermally conductive metal laminated to the composite under the heat source and plated inside a centrally located through hole drilled in the composite.

Coating the area defined by the wall opening made in the composite with a thermally conductive metal optionally produces superior results compared to a design which leaves bare the walls which define the opening.

Accordingly, an object of the invention is to more efficiently spread heat generated by a heat source and optimize its flow to a heat sink.

Another object of the invention is to verify that the invention technique for heat spreading and locally increasing the through-thickness thermal conductivity of a hybrid structural/thermal laminate substantially lowers the temperature of the composite.

A further object of the invention is to experimentally determine if the technique of laminating high and low thermal conductivity fibers can be adapted to structural composites designed for use in spaceborne applications.

Yet another object of the invention is to create an efficient thermal path normal to high thermal conductivity pitch fiber/epoxy plies in order to reduce heat buildup at the interface.

Still another object of the invention is to provide solutions for two separate thermal control problems which occur when using lightweight, high thermal conductivity fiber in a typical low thermal conductivity matrix material.

Other objects of the invention will become apparent from the following detailed description of the embodiment of the present invention when taken in conjunction with the accompanying drawings.

BRIEF DESCRIPTION OF THE DRAWINGS

FIG. 1 is a sectional elevated view of the polymer matrix composite heat sink embodying the invention;

FIG. 2 is a one-quarter model of finite element temperature contour plots for a hybrid pitch fiber/epoxy and carbon fabric/epoxy with no copper on the surface of the composite;

FIG. 3 is a one-quarter model of finite element temperature contour plots for a hybrid pitch fiber/epoxy and carbon fabric/epoxy with copper plated on an area on the surface; and FIG. 4 is a one-quarter model of finite element temperature contour plots for the configuration shown in FIG. 3 but with a predetermined diameter copper plated through hole opening drilled in the center.

The same reference characters refer to the same elements throughout the several embodiments of the invention.

DESCRIPTION OF THE INVENTION

Referring to the drawings, and particularly to FIG. 1, the organic matrix composite structure of the invention, generally indicated 10, is shown as a hybrid comprising a multiplicity of plies 12 and 14 each composed of relatively thin epoxy material. The plies 12 and 14 are interlaminated one on the other to form a parallel array. The plies 12 consist of high thermal conductivity pitch fiber/epoxy. Interlaminated with the plies 12 are the plies 14 composed of low thermal conductivity carbon/epoxy. The configuration chosen for the interlaminations is [±10, (45°), ±10, ($\overline{45°}$)]. As is well known to those skilled in the art of composite construction, the ±10 indicates, using a 0 axis, that the first layer of pitch fiber is a ±10°. The next layer of pitch fiber is at a −10° relative to that axis. The (45°) indicates that the first carbon fabric layer is offset by 45°. The pattern for the pitch fiber plies then repeats itself with a ±10° in inverse order. The strike over the last 45° indicates that the lamination of the carbon fiber plies is symmetrical about the other side as well.

Heat generated by a heat source located above the hybrid 10 is illustrated by the lines 16. The heat source is an ordinary electronic component in the form of a resistor 18 having customary $I^2R$ losses represented by the lines 16. The lines 16 also serve to indicate the through-thickness thermal conductivity direction of the hybrid 10 as opposed to the longitudinal direction of maximum thermal conductivity of the plies 12 indicated by the arrows 17. In the preferred embodiment, either one or both of the outer or exterior surfaces of the high thermal conductivity pitch fiber/epoxy plies 12 is cured with a lining of a thermally conductive metal, such as copper 19. Any superfluous metal is then etched away as indicated by the bare area on the exposed surfaces of the upper and lower ones of the high thermal conductivity pitch fiber/epoxy plies 12.

To qualitatively investigate the effect of transverse and through-thickness heat transfer, a 2.5-inch square composite sample subjected to heat radiated from a 0.70-inch diameter heat source was modeled. Due to heat load and geometry symmetry only one-quarter of the sample was modeled with symmetry boundary conditions imposed. The outer layers of the model, as shown in FIG. 1, consisted of high thermal conductivity pitch fiber/epoxy 12 interlaminated with the low thermal conductivity carbon fabric/epoxy 14 in the previously described configuration. This configuration was chosen for the ability of the carbon fabric to carry structural loads and the pitch fiber to carry thermal loads. Isolation of the high thermal conductivity layers from one another by the low conductivity fabric was desired to exacerbate, for the purpose of acquiring qualitative data, the problem of through-heat transfer in the direction indicated by the arrows 16. In one embodiment, the base model consisted of 1,087 solid orthotropic elements. The thermal conductivity for the plies in each of the longitudinal, transverse and through-thickness directions for both the carbon fabric/epoxy and the pitch fiber/epoxy are listed in Table I.

TABLE I

THERMAL CONDUCTIVITIES FOR FINITE ELEMENT MODEL

| Material | $k^*_{x^9x^9}$ (W/m*K) | $k^*_{y^9y^9}$ (W/m*K) | $k_{z^1z^1} = k_{zz}$ (W/m*K) | θ (Degrees) | $k^*_{xx}$ (W/m*K) | $k^*_{yy}$ (W/m*K) |
|---|---|---|---|---|---|---|
| K1100/EARL 1939-3 h Fiber | 500 | 3.5 | 3.5 | 10 | 486 | 21 |
| MHF-322D/7714 AC on Fabric | 3.5 | 3.5 | 1.4 | 45 | 3.5 | 3.5 |

The thermal conductivities shown in Table I will transform from the local element material coordinates to global coordinates according to the following formula:

$$k_{ik} = \sum_{r=1}^{3}\sum_{s=1}^{3} C_{ri}C_{sk}k_{rs} \tag{1}$$

where $k_{ik}$ are the thermal conductivities in the global coordinate direction, $k_{rs}$ are the thermal conductivities in the material coordinate system (Table I), and $c_{ri}$ and $c_{sk}$ are the direction cosines of the material relative to the global coordinate systems. After expansion, the in-plane thermal conductivities (k) in the global system (x', y') in terms of the angle (θ) between the x' and x coordinate directions and the material coordinate system (x, y) are given as:

$$k_{x'x'} = k_{xx}\cos^2\theta + k_{yy}\sin^2\theta \tag{2}$$

$$k_{y'y'} = k_{xx}\sin^2\theta + k_{yy}\cos^2\theta \tag{3}$$

The model was exercised for three configurations, that is, no thermally conductive metal on the outer surfaces of the hybrid 10, a thickness of thermally conductive material over a predetermined diameter area on the upper surface 20 of the hybrid 10, and a predetermined thickness of thermally conductive metal over a predetermined diameter area on the upper and lower surfaces of hybrid 10 but with a through hole opening 28 of predetermined diameter drilled in the center of the hybrid, the walls of the opening 28 being covered with a layer of plated thermally conductive metal 30, preferably copper, as copper was found to be an ideal material to be used as a thermally conductive metal in all of the experimental models. The through hole opening 28 is in communication with the upper and lower surfaces of hybrid 10, according to the orientation of the plies 12 and 14 shown in FIG. 1.

A constant source of 0.434 watts was applied to a circular area 0.70 inches in diameter, for all three configurations, in the center of a 2.5-inch square area of the composite. Explained in slightly different terms, the high thermal conductivity pitch fiber/epoxy 12 shown in FIG. 1 was layered-up alternately with the low thermal conductivity carbon fabric/epoxy layers 14 and sandwiched between two layers of copper foil. In actual practice, as shown by the reference numeral 29, the copper foil is etched away except for the limited area adjacent to the location of the heat source. A 60-inch square area of the hybrid laminate was vacuum bagged and autoclaved cured at 180° C. and 0.69 MPa pressure. When cured this laminate was cut into 2.54 cm×2.54 cm samples. Various drill diameters and feed rates were investigated which would result in minimum damage to the composite. The drilling produced in the composite through hole opening 28 which established heat transfer paths both transverse to and longitudinal to the maximum thermal conductivity paths 17 of the high conductivity pitch fiber/epoxy plies 12.

With respect to FIGS. 2, 3 and 4, the manufacturing process of the present invention for manufacturing an organic matrix composite heat sink is explained as follows. Thermal results from three finite element models of hybrid high thermal conductivity pitch fiber/epoxy plies 12 alternated with the low thermal conductivity carbon fabric/epoxy plies 14 in a [±10, (45°), ±10, ($\overline{45°}$)] configuration were developed in connection with FIGS. 2, 3 and 4. The model shown in FIG. 2 is bare of copper on any of its surfaces. The model shown in FIG. 3 is shown with the copper layer 19 over the radially inward parts of the top ply 12, and the model shown in FIG. 4 is identical to that shown in FIG. 3 but differing from it by the addition of a copper ply on the bottom surface 22 and the through hole opening 28 centrally of and extending between the upper and lower surfaces of the hybrid 10. As shown in FIG. 4, the upper and lower surfaces of the hybrid as well as the walls of the surface defined by the opening 28 are plated with a thermally conductive metal. In the experimental case, the preferred metal is copper. Since the size of the sample as well as the strength of the heat source can affect actual results, it will be understood that the models shown in FIGS. 2, 3, and 4, were not intended to produce accurate quantitative results, but rather to show the relative difference in quantity of the results when copper is added and the results obtained with an opening through the hybrid and copper plating added to the walls of the opening. In our experiments the heat source area remained constant as well as the total heat input of 0.434 watts. The increase in high surface thermal conductivity with the addition of the copper plating (FIG. 3) resulted in a 35% reduction in the maximum surface temperature on the composite when the model of FIG. 3 is compared to the model of FIG. 2. It is thought that this reduction is probably due to the additional heat spreading effect of the surface copper plating. The addition of the copper plated hole 28 further increased the through-thickness conductivity or the high conductivity fibers 12 by reducing the maximum surface temperature another 35%, i.e., when a comparison is made between FIGS. 2 and 4. It was found that the overall reduction in maximum surface temperature from the hybrid high/low thermal conductivity composite to the same composite with the addition of a copper plated surface area and through-thickness copper plated hole was 58%, i.e., in the comparison made between the models shown in FIGS. 2 and 4. Again, it is stressed that these are only qualitative results which show that the surface transverse as well as through-thickness thermal conductivity is affected by this process.

From the foregoing description, it will be understood that the invention proposes a finite element model constructed of a composite in combination with a centrally applied heat source. The laminate consists of a hybrid of high thermal conductivity pitch fiber/epoxy on the outside of the surface interlaminated with low thermal conductivity carbon fabric/epoxy in a preferred configuration. The model plated with copper on the surface under the heat source had a maximum surface temperature 35% lower than the model thereof with no copper to spread the heat. The model with copper on the surface and having a central copper plated hole showed a maximum surface temperature 58% lower than with the FIG. 2 model bare of copper on either the upper or lower surfaces. Accordingly, it is thought that the model having copper plating on the upper and lower surfaces of the hybrid, in addition to the copper plated central opening, enhances, the spread of heat and increases the through-thickness thermal conductivity of a hybrid exposed to conduction from a heat source.

The samples were drilled with different diameter drills and feed rates in order to obtain the optimum effects of minimal surface damage and maximum adhesion of the copper plate to the edges of the pitch fiber/epoxy and carbon-epoxy exposed to the drill. It is thought, therefore, that it is more cost effective and less time consuming to spread the heat and increase through-thickness thermal conductivity by including copper foil on the composite under the heat source and by adding copper plating to the wall of the through hole.

Based upon the above-description of the preferred embodiment, the present invention will find application where light-weight conduction cooled structures are required to remove heat from high heat density sources, such as spacecraft and flight hardware. The hybrid composite of the present invention provides excellent directional thermal conductivity as well as structural support, and, by use of the technique of the present invention, it will experience a reduced temperature buildup at typically low thermal conductivity organic matrix composites with high heat density interfaces.

It will be understood that the invention is not limited to the embodiments described above, it being apparent to those skilled in the art that various changes and modifications can be made without departing from the spirit of the invention or the scope of the appended claims.

We claim:

1. A light weight heat sink for increasing a through thickness thermal conductivity of an organic matrix structure exposed to radiation and/or conduction from a heat source, said heat sink comprising:

a hybrid composite comprising two sets of organic matrix interlaminations in a parallel array;

a first set of said organic matrix interlaminations having characteristics of high directional in-plane thermal conductivity;

a second set of said organic matrix interlaminations having characteristics of low thermal conductivity relative to said first set of said organic matrix interlaminations, no metal bonding between or on said first and second sets of said organic matrix interlaminations;

two laminations of said first set of organic matrix interlaminations forming outer top and bottom surfaces of said composite;

said composite having a cylindrical bore therethrough in communication with said top and bottom surfaces thereby providing within said bore two terminal end exposed surfaces of each of said first and second sets of said organic matrix interlaminations; and a thermally conductive metal deposited locally on said outer top and bottom surfaces and plating said terminal end exposed surfaces of each of said first and second sets of said organic matrix interlaminations to direct heat locally in the through-thickness direction normal to said first and second sets of said organic matrix interlaminations.

2. A heat sink in accordance with claim 1, wherein said metal is copper.

3. A heat sink according to claim 1, wherein said first set of said interlaminations having characteristics of high thermal conductivity includes graphite fiber/epoxy plies and wherein said second set of interlaminations having characteristics of low thermal conductivity includes graphite fabric/epoxy plies.

* * * * *